Figure 1:
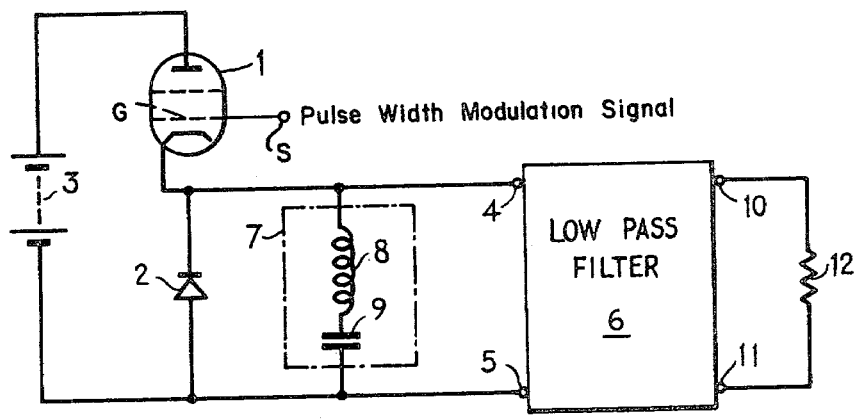

United States Patent [19]

Cooper et al.

[11] 4,250,469

[45] Feb. 10, 1981

[54] FILTER FOR CONVERTING PULSE WIDTH MODULATION TO AMPLITUDE MODULATION

[75] Inventors: David Cooper; Philip J. Davidson, both of Chelmsford, England

[73] Assignee: The Marconi Company, Limited, Chelmsford, England

[21] Appl. No.: 17,053

[22] Filed: Mar. 2, 1979

[30] Foreign Application Priority Data

Mar. 2, 1978 [GB] United Kingdom ............... 8223/78

[51] Int. Cl.$^3$ .............................................. H03C 1/06
[52] U.S. Cl. ..................................... 332/1; 332/9 R; 332/37 R; 332/64; 455/108
[58] Field of Search ................ 332/1, 41, 31 R, 37 R, 332/52, 64, 66, 9 R, 9 T, 10; 325/38 R, 142, 182; 455/108, 109

[56] References Cited

U.S. PATENT DOCUMENTS

| 2,968,010 | 1/1961 | Case, Jr. | 332/9 R X |
| 3,384,838 | 5/1968 | Knutrud | 325/142 X |
| 3,435,378 | 3/1969 | Birt | 332/9 R X |
| 4,118,677 | 10/1978 | Weldon | 332/9 R |

Primary Examiner—Siegfried H. Grimm
Attorney, Agent, or Firm—Diller, Ramik & Wight

[57] ABSTRACT

In a high efficiency amplitude modulation circuit. A pulse width modulation switch is arranged with a low pass filter to attentuate switching frequencies of the switch. A diode is connected in parallel with the input terminals of the low pass filter which diode provides a current discharge path for the filter while the switch is non-conductive. A further filter is also connected in parallel with the input terminals of the low pass filter, this further filter being arranged to provide cancellation of the input susceptance of the low pass filter over at least part of its pass band. The two filters in combination are such as to present a constant input conductance over at least part of the pass band of the low pass filter.

6 Claims, 2 Drawing Figures

FILTER FOR CONVERTING PULSE WIDTH MODULATION TO AMPLITUDE MODULATION

This invention relates to modulation circuits and more specifically to amplitude modulation circuits utilising a pulse width modulator. In order to provide a high efficiency amplitude modulation circuit, it has been proposed to use a pulse width modulator which, itself, absorbs relatively little power to produce a digital pulse train having a variable mark-space ratio and to follow it by a low pass filter which derives a variable amplitude waveform from the pulse train. Such arrangements, although efficient can, under some circumstances, introduce distortions into the variable amplitude waveform. The present invention seeks to provide an improved modulation circuit.

According to this invention, an amplitude modulation circuit includes a pulse width modulation switch and a low pass filter arranged to attenuate frequencies at the switching frequency of the switch, a device connected in parallel with a pair of input terminals of the low pass filter and which device provides a current discharge path for the low pass filter while the switch is non-conductive, and a further filter also connected in parallel with the said pair of input terminals and which is arranged to provide substantial cancellation of the input susceptance of the low pass filter over at least part of its pass band.

Preferably, said device is a diode, although it could, in principle, be a further switch controlled so as to be conductive only whilst said switch is non-conductive.

Preferably, the low pass filter and said further filter in combination present a substantially constant input conductance over at least part of the pass band of the low pass filter.

Preferably again, the further filter is arranged to have a resonant frequency of about $\sqrt{3}.B$ where B is the pass band of the low pass filter.

Preferably yet again, the further filter is arranged to have an inductance of about one third of the inductance presented by the low pass filter at said pair of terminals.

Figure 2:
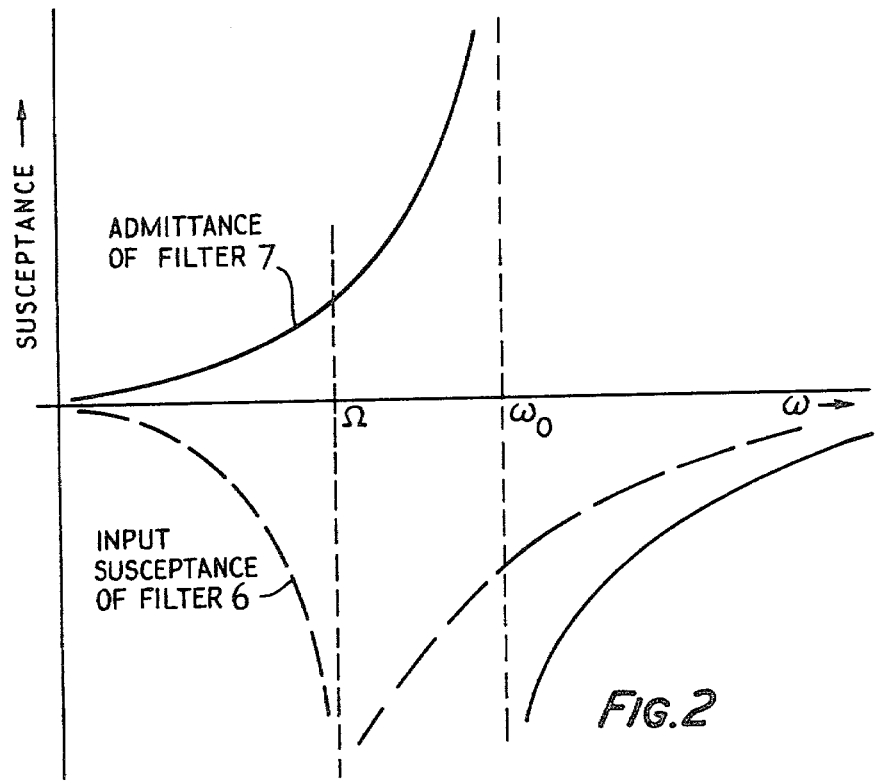

The invention is further described, by way of example, with reference to the accompanying drawings in which, FIG. 1 illustrates an amplitude modulation circuit in accordance with the present invention, and FIG. 2 is an explanatory diagram.

Referring to FIG. 1, there is shown therein an amplitude modulation circuit having a pulse width modulation stage consisting of a switch 1. The switch 1 is a high power tetrode valve connected in series with a diode 2 across a source 3 of d.c. potential. The diode 2 is connected in parallel with the input terminals 4, 5 of a low pass filter 6, and is also in parallel with a further filter 7. The further filter 7 is a series resonant circuit, and consists of an inductor 8 and a capacitor 9. The output terminals 10, 11 of the low pass filter are connected to a load, represented by a resistor 12.

The amplitude modulation circuit is primarily intended for use with the output stages of a high power broadcast transmitter, although clearly it is of general application. The switch 1 is typically a high power tetrode valve, which is controlled so as to be either fully conductive or non-conductive in dependence on the instantaneous level of a control signal as indicated at S applied to its control grid G. In this way a pulse width modulation signal is produced, and because relatively little power is absorbed by the switch 1 this represents an efficient form of modulation which is particularly suitable for high power applications. The pulse width modulation signal consists of a train of pulses of substantially constant amplitude, but of variable durations in dependence on the amplitude modulation. This pulse train must be converted into an amplitude modulation signal so that it can be used in a conventional manner to modulate the plate potential of the output amplifier tube (not shown, but represented by load resistor 12). The output tube used is, again, typically a tetrode valve, and a high frequency carrier signal is applied to its control grid, so that its envelope is amplitude modulated by the varying potential on the plate of the valve.

For the purpose of converting the pulse width modulation signal to an amplitude modulation signal, the pulse train is passed through a low pass filter having its cut-off frequency below the switching frequency of the switch 1. The switching frequency is typically 70KHz. The diode 2 is provided so that while the switch 1 is non-conductive a current path still exists for the reactive components of the low pass filter to discharge and so provide a continuous current through the load represented by the resistor 12.

It has been found that for large amplitude excursions the potential across the diode 2, while the switch 1 is non-conductive, may momentarily be such as to reverse bias the diode 2, thereby preventing the current through the resistor 12 from faithfully following the intended amplitude valve. The effect is such as to introduce distortions into the envelope of the amplitude modulated signal, and to excite undesirable and possibly dangerous oscillatory transients in the circuit. The presence of the further filter 7 overcomes this difficulty and in order to provide the best compensation the electrical characteristics should be as follows. The resonant frequency of the further filter 7 is $\sqrt{3}.B$, where B is the usable frequency bandwidth of the low pass filter 6. The inductance of the further filter 7 is one third of the inductance of the input section of the low pass filter 7. Additionally, the ratio of the switching frequency of the switch 1 to the bandwidth of the low pass filter should exceed 8 to 1.

The variation with frequency of the admittance of the further filter 7 and the variation of the input susceptance of the low pass filter 6 are shown in FIG. 2. In this Figure, $\Omega$ is the cut-off frequency of the low pass filter 6, and $\omega_o$ is the resonant frequency of the further filter 7. It can be seen that the magnitude of the input susceptance of the low pass filter 6 and the admittance of the further filter 7 vary in approximately the same way with frequency over at least part of the pass band of the filter 6, but that their signs are opposite, making compensation possible to given an approximately zero susceptance.

We claim:

1. An amplitude modulation circuit including pulse width modulation switch means adapted to be connected to a d.c. power source and a switching control signal for producing a train of variable durations pulses of selected switching frequency and low pass filter means having a pair of input terminals connected with said switch means to receive said train of pulses for attenuating frequencies at the switching frequency of the switch means, a device connected in parallel with said pair of input terminals of the low pass filter and which device provides a current discharge path for the low pass filter while the switch is non-conductive, and a further filter also connected in parallel with the said pair of input terminals and which is arranged to provide substantial cancellation of the input susceptance of the low pass filter over at least part of its pass band.

2. A circuit as claimed in claim 1 and wherein said device is a diode.

3. A circuit as claimed in claim 1 and wherein the low pass filter and said further filter in combination present a substantially constant input conductance over at least part of the pass band of the low pass filter.

4. A circuit as claimed in claim 1 and wherein the further filter is arranged to have a resonant frequency of about $\sqrt{3}.B$ where B is the pass band of the low pass filter.

5. A circuit as claimed in claim 1 and wherein the further filter is arranged to have an inductance of about one third of the inductance presented by the low pass filter at said pair of terminals.

6. An amplitude modulation circuit including a low pass filter having a pair of output terminals to which a load is adapted to be connected and a pair of input terminals, to which a train of variable durations pulses of substantially constant amplitude is to be applied, means for applying said train of pulses to said filter, said means comprising a d.c. power supply and a pulse width modulation switch connected to said input terminals of said filter to provide said train of pulses thereto, said switch including input means for controlling the switch to be conductive or non-conductive to provide said train of variable durations pulses at a selected switching frequency whereby said filter accepts said train of pulses of attenuating frequencies at said switching frequency of said switch, a device connected in parallel with said pair of input terminals of said low pass filter so as to provide a current discharge path for the low pass filter while said pulse width modulation switch is non-conductive, and a further filter also connected in parallel with said pair of input terminals so as to provide substantial cancellation of the input susceptance of said low pass filter over at least part of its pass band.

* * * * *